United States Patent [19]

Hou

[11] Patent Number: 5,933,325

[45] Date of Patent: Aug. 3, 1999

[54] DETACHABLE FASTENING DEVICE FOR USE WITH HEAT SINK

[75] Inventor: Kai Hou, Chino Hills, Calif.

[73] Assignee: Hon Hai Precision Ind. Co., Ltd., Taipei Hsien, Taiwan

[21] Appl. No.: 09/098,450

[22] Filed: Jun. 17, 1998

[51] Int. Cl.[6] .................................................. H05K 7/20
[52] U.S. Cl. .................... 361/704; 361/707; 361/709; 361/710; 257/718; 257/719; 257/727; 174/16.3; 165/80.3
[58] Field of Search ..................................... 361/704, 709, 361/710, 717–719, 722; 165/80.3, 185; 257/706, 707, 717–719, 727; 174/16.3; 24/457, 458, 295; 267/150, 160

[56] References Cited

U.S. PATENT DOCUMENTS

| | | | |
|---|---|---|---|
| 4,462,462 | 7/1984 | Meagher et al. | 165/80.1 |
| 5,247,425 | 9/1993 | Takahasi | 361/717 |
| 5,396,402 | 3/1995 | Perugini et al. | 361/704 |
| 5,638,258 | 6/1997 | Lin | 361/704 |
| 5,751,062 | 5/1998 | Daikoku et al. | 257/718 |

Primary Examiner—Leo P. Picard
Assistant Examiner—Boris L. Chervinsky

[57] ABSTRACT

A retaining clamp device (10) for use with a heat sink (40) of the CPU (50) unit includes a clip (12) and an associated spring (30) attached to the clip (12) wherein the clip (12) includes an elongated main body (14) with a pair of locking tags (18) downward extending at two opposite ends thereof to respectively cooperate with the lugs (62) on the side walls (64) of the socket (60) under the CPU (50) for latching the retaining clamp device (10) unto the CPU (50) set while the spring (30) is in a wave-like form and positioned between the main body (14) of the clip (12) and the top surface (48) of the heat sink (40) so as to exert the sufficient biasing force firmly pressing the heat sink (40) against the CPU (50) for efficient heat transfer thereof, by means of its deformation derived from the less space/height between the main body (14) of the clip (12) and the top surface (48) of the heat sink (40) in comparison with the original height of the spring (30).

5 Claims, 4 Drawing Sheets

DETACHABLE FASTENING DEVICE FOR USE WITH HEAT SINK

BACKGROUND OF THE INVENTION

1. Field of The Invention

The invention relates to detachable fastening means for use with the heat sink of a CPU set, and particularly to a customized fastening means for use therewith.

2. The Related Art

Traditional clips for fastening a heat sink to a CPU, is generally of one piece as shown in U.S. Pat. No. 5,602,719. Such clip includes a resilient strip type main body with two locking tags at two opposite ends for respectively latching to the socket under the CPU whereby the strip type main body will be deflected to exert a force for pressing against the heat sink and firmly attaching the heat sink to the CPU. Simultaneously, the clip may further include a handle at one end for easy operation of the clip with regard to the heat sink and the associated CPU set.

One disadvantage of the conventional clip is that such one-piece clip can not accommodate the variation in dimension of the size of the socket because the spring force changes considerably even with the small variation. Another disadvantage is that the clip should produce two, i.e., one biasing and one retention, forces from the same spring constant—one between the tags of the clip bearing on the sidewalls of the socket and the other bearing against the top surface of the heat sink through flexing of the top member. This inherent requirement results in high tolerance and precision of the clip itself and difficulties in manufacturing. In other words, the clip should effect engagement not only between the heat sink and the CPU but also between the clip and the socket. From another viewpoint, because the clip is of one piece providing both aforementioned engagements, it is difficult to achieve a fast, easy and delicate release of the clip from the socket while maintaining the required sufficient pressing force derived from the strap type main body of the clip and imposed on the heat sink.

Accordingly, U.S. Pat. Nos. 5,600,540 and 5,671,118 introduce a two-piece retainer clip for use with the heat sink wherein one piece is an elongated strap having a bent portion that bears down on the heat sink to force it into a heat conducting relationship with the CPU thereunder and also includes one locking tag with a first latching opening at one end of the strap for being hooked on one corresponding protrusion or lug on the side wall of the socket. The second piece is rotatably mounted on the end of the strap opposite to the locking tag and when forced down and rotated inward, a second latching opening will hook on the other corresponding protrusion or lug on the other side wall of the socket. Regardless of whether the aforementioned two-piece type clip fully overcome the shortcomings of the one-piece type clip, there is a concern regarding the strap which is still used, with its one end, to latch itself unto the socket and then still owns one aforementioned shortcoming of the one piece type clip. Additionally, because the second piece is substantially freely rotatably mounted to the first piece for easy and fast releasing the whole retainer clip from the socket, this swinging structure arrangement generally diminishes the originally designed biasing force to the heat sink. Thus, when a relative huge heat sink is applied to the CPU set, it is questionable whether this swinging type retainer clip can achieve the required relatively large biasing force against the heat sink for assuring the reliable and tight engagement between the heat sink and the CPU during a severe vibration situation.

Therefore, an object of the invention is to provide a retaining clamp device for use with the heat sink of CPU set, which generally avoids the aforementioned shortcomings of the existing retainer clip used for the CPU set.

SUMMARY OF THE INVENTION

According to an aspect of the invention, a retaining clamp device for use with a heat sink of the CPU unit includes a clip and an associated spring attached to the clip wherein the clip includes an elongated main body with a pair of locking tags downward extending at two opposite ends thereof to respectively cooperate with the lugs on the side walls of the socket under the CPU for latching the retaining clamp device unto the CPU set while the spring is in a wave-like form and positioned between the main body of the clip and the top surface of the heat sink so as to exert the sufficient biasing force firmly pressing the heat sink against the CPU for efficient heat transfer thereof, by means of its deformation derived from the less space/height between the main body of the clip and the top surface of the heat sink in comparison with the original height of the spring.

The retaining clamp further includes a handle provided at one end of the main body of the clip and opposite to the corresponding locking tag for operatively releasing the retaining clamp from the socket and the associated heat sink thereon.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
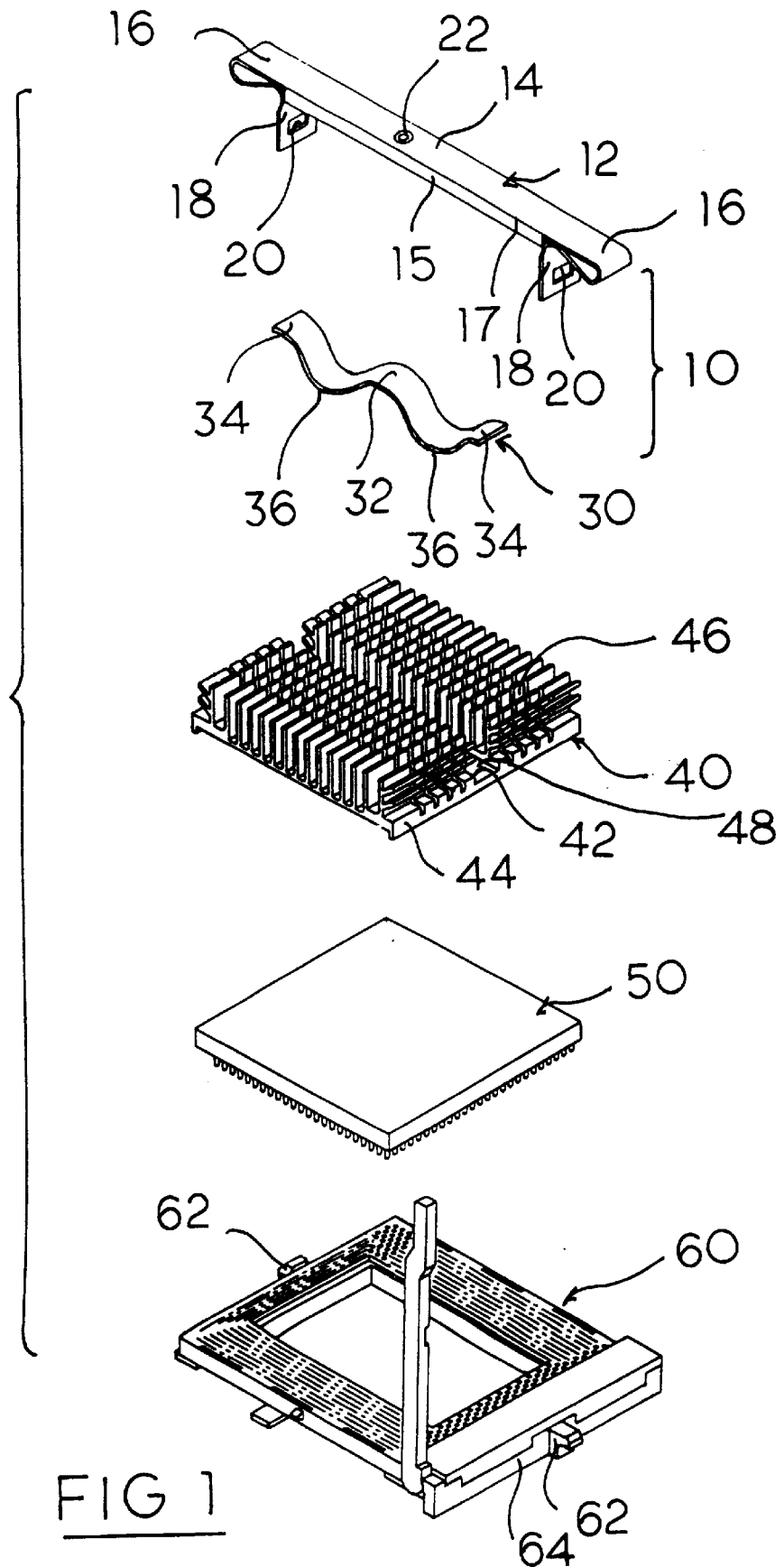
FIG. 1 is an exploded perspective view of a presently preferred embodiment of a heat sink assembly according to the invention.
Figure 2:
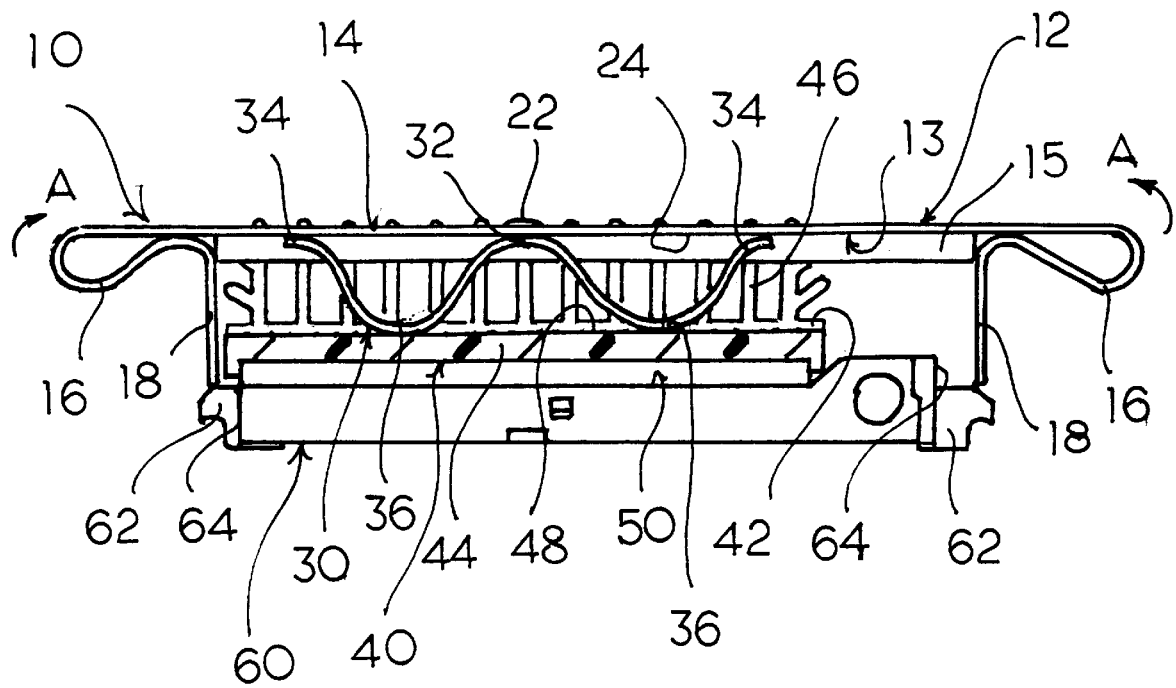
FIG. 2 is a side view of the heat sink assembly of FIG. 1 under a disengagement condition wherein the lever of the socket has been removed and the heat sink is partially cut away to show the clamp therein.
Figure 3:
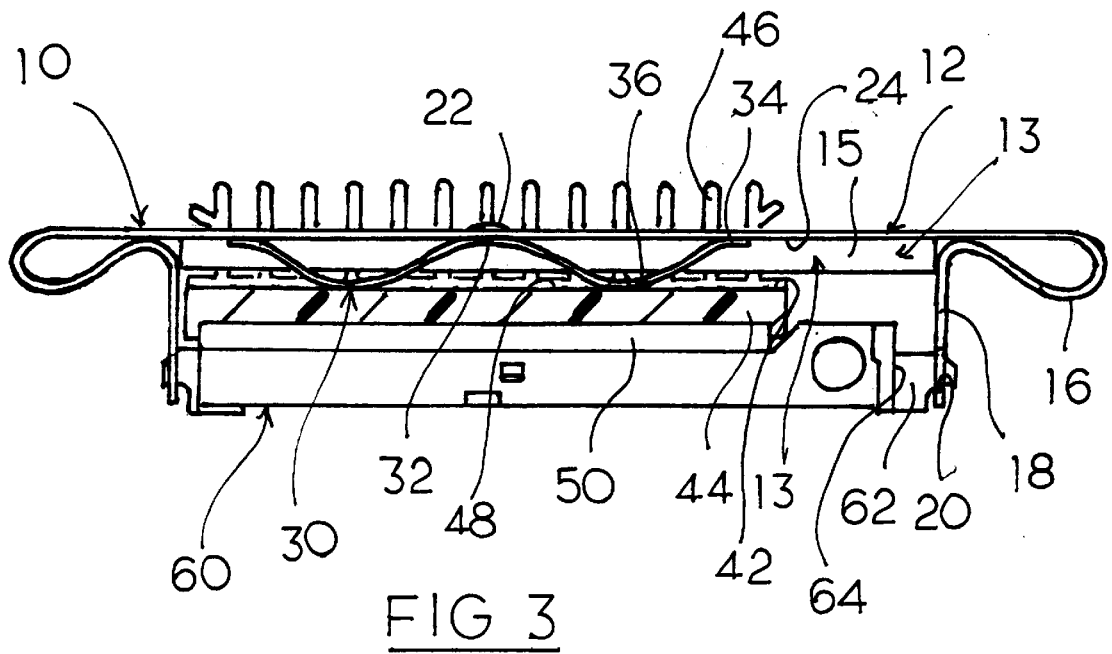
FIG. 3 is a side view of the heat sink assembly of FIG. 2 in an engagement condition.

It will be noted here that for a better understanding, most of like components are designated by like reference numerals throughout the various figures in the embodiments. Attention is directed to FIGS. 1–3 wherein a single piece retaining clamp 10 is adapted to abut against a heat sink 40 for pressing the heat sink 40 against the CPU 50 thereunder wherein the CPU 50 is seated on a socket 60 which is mounted on the mother board (not shown). The retaining clamp 10 includes a fastening device, i.e., a clip 12, defining an elongated main body 14 having a pair of confinement walls 15 extending downward from two side edges 17 of the main body 14 commonly defining a U-shaped cross-sectional configuration thereof so as to form a trough 13 for receiving a biasing device, i.e., a spring 30 therein.

A drop-like section 16 horizontally extends at either end of the clip 12 forming a handle thereof for easy operation, i.e., engagement/disengagement of the retaining clamp 12 with regard to the socket 60 wherein the drop-like section 16 is formed by inwardly folding of the material of the main body 14 at either end, from which the locking tag 18 extends downward. Each locking tag 18 defines a latching opening 20 therein for cooperatively engagement with a corresponding lug 62 on the corresponding side wall 64 of the socket 60.

The spring 30 constitutes a wave configuration by curvilinearly bending the strap like body thereof along the lengthwise direction, thus providing deflectability in a vertical direction transverse to the lengthwise direction wherein the width of the spring 30 is generally equal to the width of the trough 13 and the center peak 32 is engageably welded to a kinked recess 22 in the main body 14 of the clip 12 so that the upper portion of the spring 30 can be snugly and securely embedded within the trough 13 of the clip 12. Under this situation, the opposite ends 34 of spring 30 also engage the undersurface 24 of the main body 14 of the clip 12.

When assembled, referring to FIGS. 2 and 3, at the first stage, the retaining clamp 10 including the clip 12 and the associated spring 30 thereunder is moved downward from the top under the condition that the main body 14 of the clip 12 is generally aligned and received within the receiving slot 42 of the heat sink 40, wherein the heat sink 40 includes a base 44 and an array of fins 46 and the receiving slot 42 is formed in the fins 46, until the valleys 36 of the spring 30 confront the top surface 48 of the base 44 of the heat sink 40. At the same time, two locking tags 18 is aligned with the lugs 62 of the socket 60. Therefore, the whole structure of the retaining clamp 10 is in a disengagement/loose position.

The retaining clamp 12 further moves downward to have the locking tags 18 obliquely deformed and pass the corresponding lugs 62 until the latching opening 20 of each tag 18 completely climb over and substantially receiving the corresponding lug 62 by restoration of the locking tag 18. During this second stage, the spring 30 is substantially deflected/deformed in the vertical direction and that will result in a relatively significant spring force imposed on the top surface 48 of the base 44 of the heat sink 40. Therefore, the required biasing force can be obtained when the locking tags 18 are engaged with the lugs 62 of the socket 60, and such force assures the reliable and preferable heat transfer between the CPU 50 and the heat sink 40 due to the tight engagement therebetween. Under this situation, the retaining clamp 10 is in an engagement/compression position.

When disassembled, the drop-like section 16 is pressed downward and rotated outward a little bit as shown in arrow A, and then the latching opening 20 of locking tag 18 can be released from the corresponding lug 62, and the retaining clamp can be retracted to the original disengagement position due to restoration of the spring 30.

It can be noted that one feature of the invention is that different from the prior arts, the retaining clamp 10 uses two separate piece, i.e., the clip 12 and the spring 30, respectively providing the retention of the clamp 10 with regard to the socket 60 and the biasing force against the heat sink 30. Therefore, it is allowed to have the spring 30 customized to meet the different required biasing forces for different type CPU sets. The spring 30 can be made to achieve different level biasing forces by different pitch, thickness, height, width or even material arrangements. It is understood that because the clip 12 and the spring 30 are separate pieces, it is allowed to make the clip from delicate material while making the spring 30 from a heavy duty material. Additionally, because the clip 12 and the spring 30 are made separately, it is allowed to have the spring 30 easily formed to be of a complex configuration. e.g., the wave-like, for better resiliency/reinforcement thereof, in comparison with the simple slope type biasing section of the traditional clip. The separation arrangement for the clip 12 and the spring 30 not only eliminates the influence of the spring 30 due to the impact imposed on the locking tag 18 of the clip 12, but also allows more flexibility and larger tolerance of the whole retaining clamp 10. The invention provides an easy operation and reliable heavy duty retaining clamp for use with the heat sink of the CPU set.

It is also noted that the spring 30 extending horizontally across the top surface of the heat sink 40, thus providing multiple spaced contact points with regard to the heat sink, i.e., the valleys 36, and reinforcing tight and even contact between the heat sink and the CPU thereunder.

Figure 4:
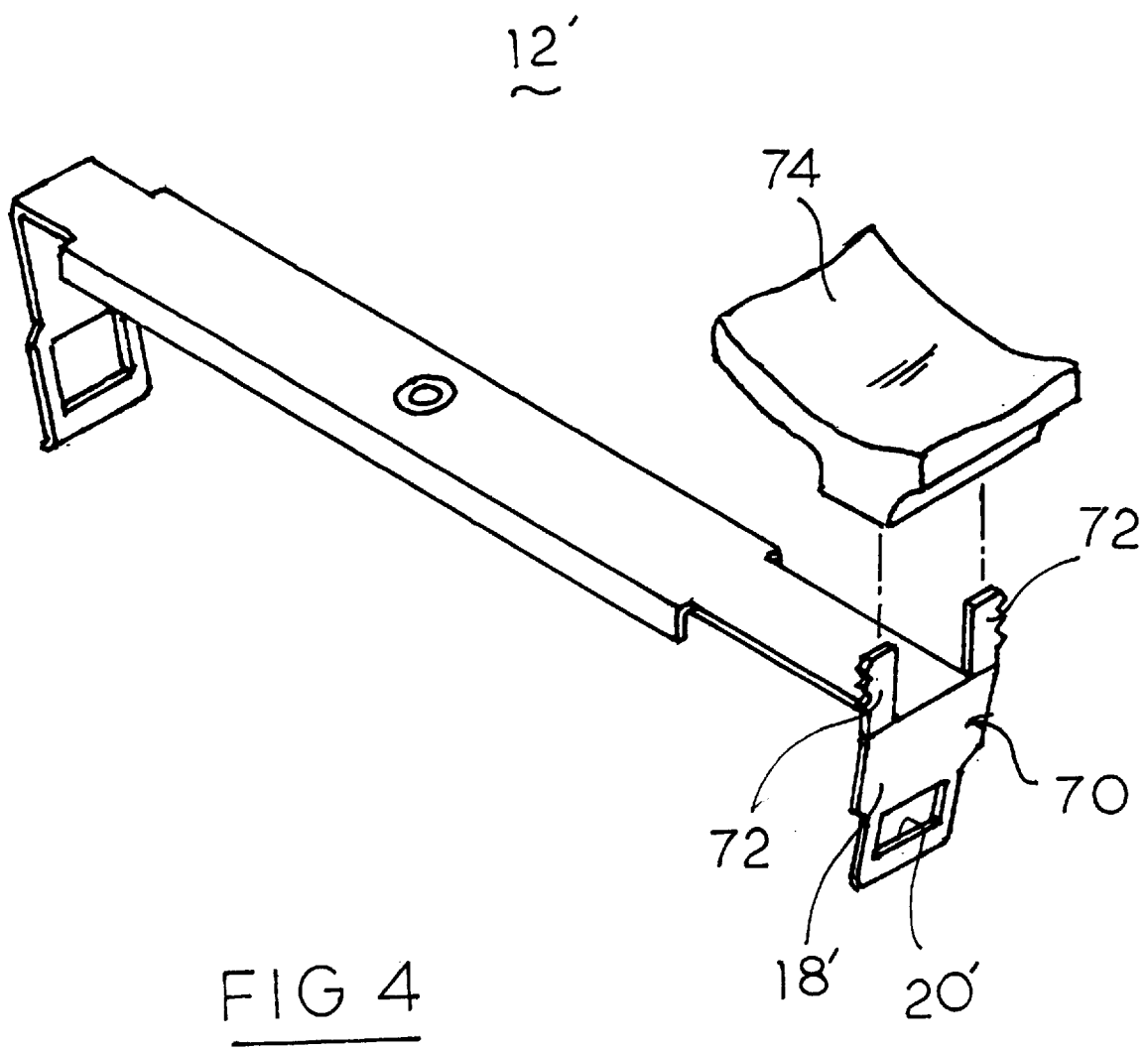
FIG. 4 is an exploded perspective view of second embodiment of the clip.
Figure 5:
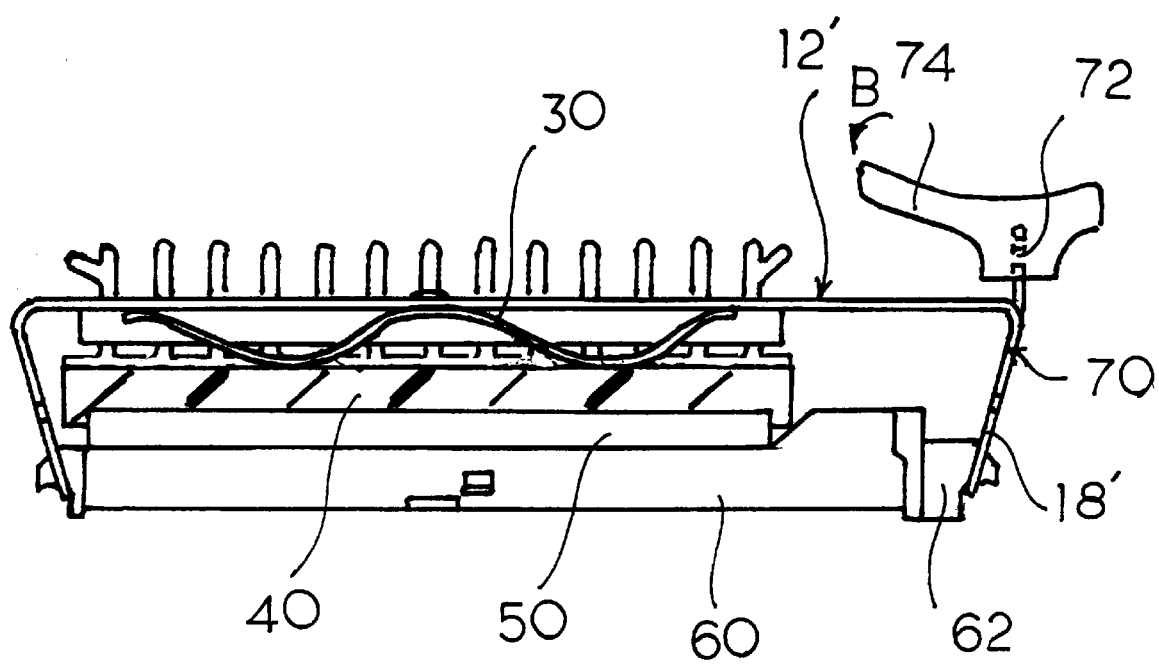
FIG. 5 is a side view of the heat sink assembly of FIG. 4.

FIGS. 4 and 5 disclose another embodiment of the clip 121 of the invention, wherein the horizontally extending drop-like section 16 is replace by a pressing section 70 which includes a pair of tangs 72 split adjacent one end of the main body, extend upward and inward opposite to the corresponding tag 18' and a button 74 is attached thereto whereby the latching opening 20' of the tag 18' can be disengaged from the lug 62 of the socket 60 by pressing downward the button 74 along arrow B.

While the present invention has been described with reference to specific embodiments, the description is illustrative of the invention and is not to be construed as limiting the invention. Various modifications to the present invention can be made to the preferred embodiments by those killed in the art without departing from the true spirit and scope of the invention as defined by the appended claims.

Therefore, person of ordinary skill in this field are to understand that all such equivalent structures are to be included within the scope of the following claims.

I claim:

1. A heat sink assembly comprising:
   a socket adapted to be mounted on a PC board;
   a CPU installed unto the socket;
   a heat sink positioned atop the CPU;
   a retaining clamp disposed atop the heat sink, said clamp including a fastening device adapted to be secured to the socket and a biasing device generally sandwiched between the fastening device and the heat sink;
   wherein said fastening device is a clip including an elongated main body extending substantially parallel to a top surface of the heat sink.

2. The heat sink assembly as defined in claim 1, wherein said biasing device is a spring generally extending along the main body of the fastening device while providing elasticity in a vertical direction perpendicular to the top surface of the heat sink.

3. The heat sink assembly as defined in claim 1, wherein the fastening device includes a locking tag adjacent to one end thereof to latchably engage a lug on a side wall of the socket.

4. The heat sink assembly as defined in claim 1, wherein the fastening device includes an elongated main body horizontally extending substantially across a top surface of the heat sink, with two locking tags downward extending adjacent to two opposite ends of the main body.

5. A combination of a heat sink assembly comprising:
   a heat sink defining a top surface thereon;
   a retaining clamp including a fastening device defining an elongated main body extending in a horizontal direction, and a biasing device extending along the main body of the fastening device and substantially deformably sandwiched between the fastening device and the top face of the heat sink so as to impose a biasing force on the heat sink;
   wherein the biasing device provides multiple spaced contact points with regard to the heat sink along said horizontal direction.

* * * * *